(12) United States Patent  
Kitabatake

(10) Patent No.: US 7,126,169 B2  
(45) Date of Patent: Oct. 24, 2006

(54) SEMICONDUCTOR ELEMENT

(75) Inventor: Makoto Kitabatake, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/002,913

(22) Filed: Oct. 23, 2001

(65) Prior Publication Data

US 2002/0047124 A1 Apr. 25, 2002

(30) Foreign Application Priority Data

Oct. 23, 2000 (JP) ........................................ 2000-323088

(51) Int. Cl.
*H01L 31/0328* (2006.01)

(52) U.S. Cl. ........................ 257/192; 257/328; 257/368; 257/187

(58) Field of Classification Search ................. 257/192, 257/328, 187, 368, 77, 330–47, 73; 438/203–225

See application file for complete search history.

(56) References Cited

U.S. PATENT DOCUMENTS

| 4,641,163 A | * | 2/1987 | Tihanyi |
| 4,823,172 A | * | 4/1989 | Mihara |
| 5,545,905 A | | 8/1996 | Muraoka et al. |
| 5,614,749 A | | 3/1997 | Ueno |
| 5,693,569 A | * | 12/1997 | Ueno |
| 5,915,179 A | | 6/1999 | Etou et al. |

FOREIGN PATENT DOCUMENTS

| JP | 2-100367 | 4/1990 |
| JP | 3-110867 | 5/1991 |
| JP | 4-261065 | 9/1992 |
| JP | 6-302811 | 10/1994 |
| JP | 7-131016 | 5/1995 |
| JP | 8-204179 | 8/1996 |
| JP | 9-55507 | 2/1997 |
| JP | 9-102602 | 4/1997 |
| WO | 00/51167 | 8/2000 |

* cited by examiner

*Primary Examiner*—Fetsum Abraham
(74) *Attorney, Agent, or Firm*—Hamre, Schuman, Mueller & Larson, P.C.

(57) ABSTRACT

The present invention provides a semiconductor element in which the field-effect transistor and the Schottky diode are arranged such that a depletion layer stemming from the Schottky diode is superimposed on a depletion layer stemming from a junction between a second conductivity type semiconductor constituting the field-effect transistor and a drift region (first conductivity type semiconductor) in an off-state. Furthermore, the present invention provides a semiconductor element in which the field-effect transistor and the Schottky diode are arranged so that a second conductivity type semiconductor other than the second conductivity type semiconductor constituting the field-effect transistor is not interposed between the electric field effect transistor and the Schottky diode. According to preferable embodiments of the present invention, the reverse recovery time due to a parasitic diode can be reduced by providing the Schottky diode such that the element area of the semiconductor element is not increased. Moreover, the breakdown voltage in the semiconductor element can be improved.

10 Claims, 13 Drawing Sheets

SEMICONDUCTOR ELEMENT

BACKGROUND OF THE INVENTION

1. Field of the Invention

The present invention relates to semiconductor elements, in particular, semiconductor power switching elements for controlling an inverter or the like.

2. Description of the Prior Art

A conventional semiconductor power switching element will be described with reference to FIG. 11. For a semiconductor element formed of a silicon semiconductor shown in FIG. 11, a silicon semiconductor in which an n-type epitaxial growth layer 112 is formed on an $n^+$-type silicon substrate 111 is used. P-type semiconductor regions 113 are formed in a surface of the n-type epitaxial growth layer 112, and $n^+$-type semiconductor regions 114 serving as a source region are formed in the p-type regions. As electrodes, a source electrode 119 is formed so as to be in contact with the $n^+$-type region 114 and a gate electrode 118 is formed via an insulating layer 116 that is formed by oxidation. Furthermore, a drain electrode 117 is provided on a back surface. In a vertical insulated gate field-effect transistor (vertical MOSFET) that is formed in this manner, when a bias voltage is applied to the gate electrode 118, an inversion layer is produced in the surface layer of the p-type region 113 that is immediately below the gate electrode.

In this semiconductor element, the source electrode 119 also is in contact with the p-type regions 113 to set the electric potential of the p-type region 113. Therefore, a parasitic diode with a p-type source and an n-type drain exists between the source and the drain of the transistor.

In a semiconductor element formed of a silicon carbide (SiC) semiconductor shown in FIG. 12, a vertical MOSFET having a so-called trench structure is formed. In this semiconductor element, silicon carbide is used where an n-type epitaxial growth layer 122 and a p-type epitaxial growth layer 123 are formed in this order on an $n^+$-type silicon carbide substrate 121. $N^+$-type semiconductor regions 124 to serve as source regions are formed in the surface of the p-type layer 123. A recess penetrating the p-type layer 123 is formed in the $n^+$-type region 124 by photolithography and etching to achieve a trench structure. A gate electrode 128 is provided on the surface of the recess via an insulating film 126 formed by oxidation. In the thus formed silicon carbide MOSFET having a trench structure, when a bias voltage is applied to the gate electrode 128, an inversion layer (channel) is produced in the p-type region 123 that is in contact with the trench wall surface. This element is disclosed, for example, in Silicon Carbide; A review of Fundamental Questions and Applications, edited by W. J. Choyke, H. Matsunami, and G. Pensl, Akademie Verlag 1997, Vol. II, pp. 369–388.

In this semiconductor element, for the same reason as above, since the source electrode 129 is in contact with the p-type layer 123, a parasitic diode with a p-type source and an n-type drain exists between the source and the drain.

In these semiconductor elements, a parasitic diode exists between the source and the drain, as described above, and therefore, when the semiconductor element is switched off, a delay by the amount of time required for reverse recovery of the parasitic diode occurs. This delay is caused by the fact that the pin junction continues to be on even after the semiconductor element is switched off because of the presence of minority carriers injected to the layers constituting the parasitic diode while the semiconductor element is on. Furthermore, current that has flowed until the p/n junction is no longer on constitutes a switching loss.

A semiconductor element that can solve the above-described problem involved in the production of the parasitic diode has been proposed (JP 9 (1997)-55507 A). As shown in FIG. 13, this semiconductor element is provided with a Schottky diode region adjacent to a region in which the same MOSFET as in FIG. 11 is formed. Reference numerals in FIG. 13 are the same as those shown in FIG. 11. In this Schottky diode region, the electrode 119 serving as the source electrode in the MOSFET region forms a Schottky junction with the n-type layer 112. If the Schottky diode is provided parallel to the parasitic diode in this manner, the reverse recovery time due to minority carriers can be reduced.

In the semiconductor element shown in FIG. 13, the Schottky diode is surrounded by a p-type circular guard ring region 121 to ensure the breakdown voltage. With this, an $n^+$-type channel stopper region 122 is further provided between the p-type region 113 and the p-type guard ring region 121.

With the semiconductor element of FIG. 13, when the Schottky diode region is provided, the element area is increased. The increase of the element area is detrimental to the compactness of the semiconductor element. This element attempts to improve the breakdown voltage of the Schottky diode by using the guard ring region 121 in the periphery of the Schottky diode having a relatively smaller breakdown voltage than that of a transistor. However, the presence of the further provided guard ring region 121 or the channel stopper region 122 increases the element area up to about 200%.

In the semiconductor element shown in FIG. 13 as well as in the semiconductor element shown in FIG. 11, it is advantageous that the distance d (FIG. 11) between adjacent p-type layers 113 is larger to let a large current flow. However, when the distance d is increased, depletion layers 115 (FIG. 11) due to the p/n junction are not overlapped, or even if they are overlapped, the thickness of the depletion layer is not sufficient in the vicinity of the center of the distance. Therefore, when it is attempted to increase the current capacity by increasing the distance d, all the voltage between the gate electrode 118 and the drain electrode 117 is applied substantially to the insulating film 116, so that this insulating film becomes susceptible to breakdown. Thus, in the semiconductor power switching element, in particular, when producing an element suitable for a large current, it is an important issue to ensure the breakdown voltage.

SUMMARY OF THE INVENTION

In at least preferable embodiments of the present invention, it is an object of the present invention to reduce the reverse recovery time due to a parasitic diode while suppressing an increase of the element area and/or to improve the breakdown voltage in the above-described conventional semiconductor element.

A semiconductor element of the present invention includes a field-effect transistor and a Schottky diode. The field-effect transistor includes a source electrode provided on a first surface of a semiconductor body, a drain electrode provided on a second surface opposite to the first surface and a first conductivity type semiconductor that includes a first conductivity type drift region, and a second conductivity type semiconductor. The first and second conductivity type semiconductors are included in the semiconductor body. The Schottky diode is formed by contact between the first conductivity type semiconductor and a metal electrode. The field-effect transistor and the Schottky diode are arranged such that a first depletion layer stemming from the Schottky diode is superimposed on a second depletion layer spreading around the second conductivity type semiconductor in an off-state of the field-effect transistor.

In another semiconductor element of the present invention, the field-effect transistor and the Schottky diode are arranged closely so that a second conductivity type semiconductor other than the second conductivity type semiconductor is not interposed between the electric field effect transistor and the Schottky diode.

DESCRIPTION OF THE PREFERRED EMBODIMENTS

Hereinafter, preferred embodiments of the present invention will be described.

More specifically, the present invention provides first, second and third semiconductor elements as follows.

Figure 11:
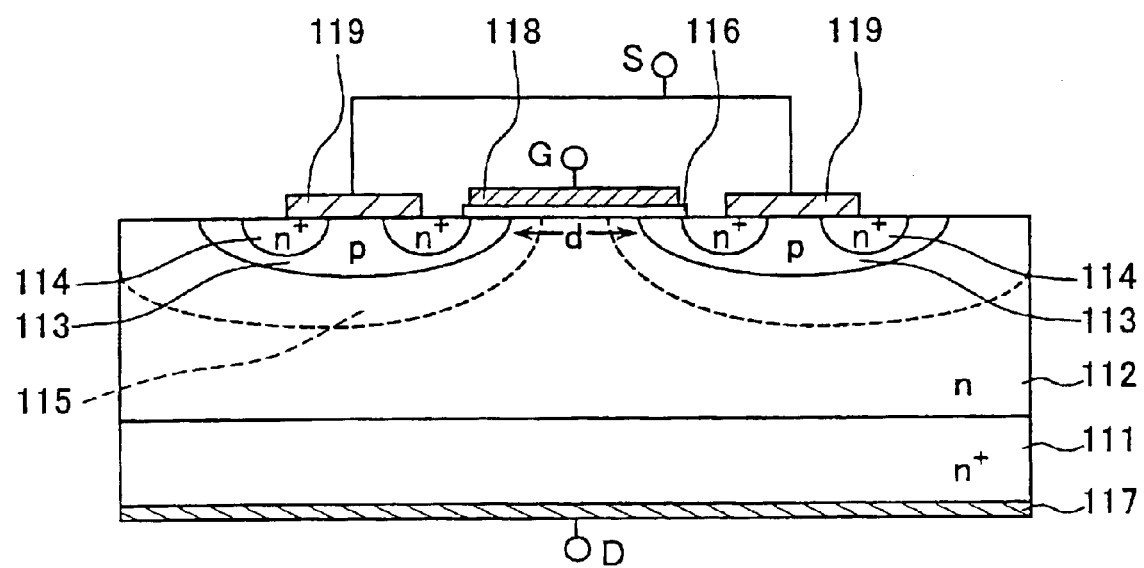
FIG. 11 is a cross-sectional view showing an example of a conventional semiconductor element.
Figure 13:
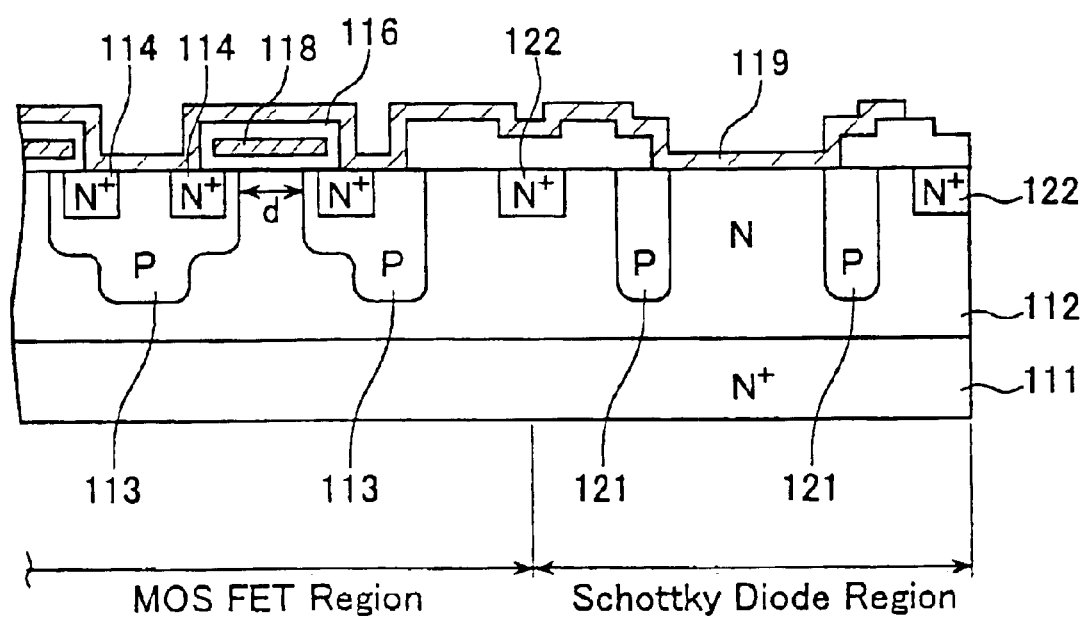
FIG. 13 is a cross-sectional view showing an example of a semiconductor element including a MOSFET and a Schottky diode.

A first semiconductor element is obtained by improving the semiconductor elements shown in FIGS. 11 and 13. This semiconductor element includes a region for a group of transistors (a transistor region) in which a plurality of MOSFETs are formed. Each of the MOSFETs further includes a first conductivity type source region formed in the second conductivity type semiconductor, and a gate electrode provided on an insulating film formed on the first surface side. In each of the MOSFETs, the second conductivity type semiconductor is provided on the first surface side, and the source electrode is provided so as to be in contact with the second conductivity type semiconductor and the source region.

In this transistor region, the Schottky diode is included in the transistor region and formed by contact between the drift region exposed between the MOSFETs on the first surface side and the metal electrode. According to this semiconductor element, the reverse recovery time due to a parasitic diode can be reduced while suppressing an increase of the element area. Furthermore, this structure is advantageous in that the current capacity can be increased while ensuring the breakdown voltage.

Figure 12:
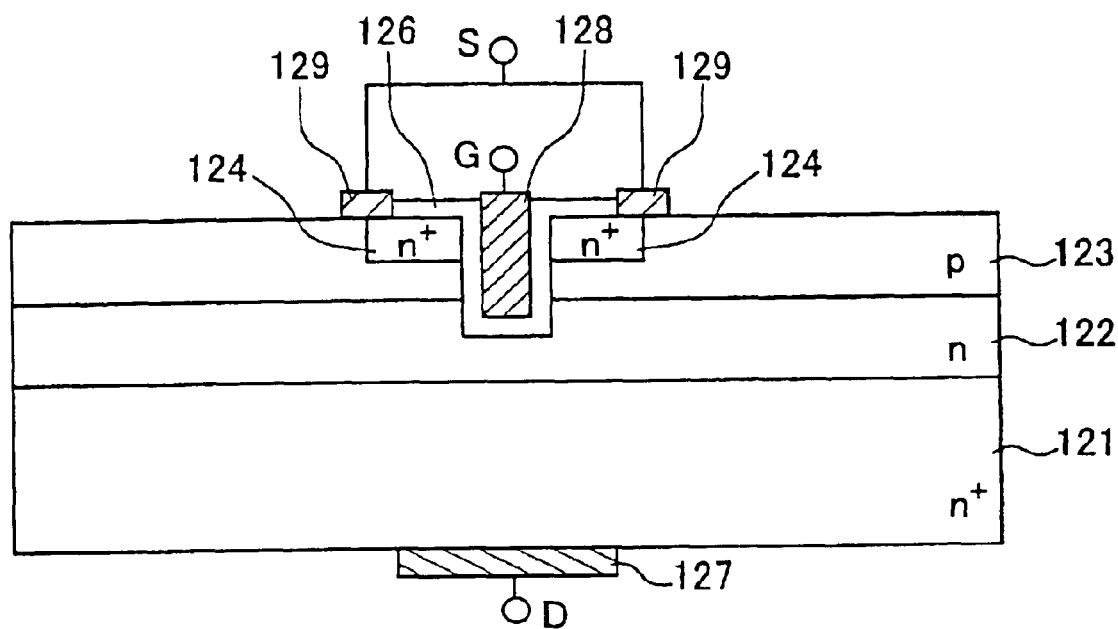
FIG. 12 is a cross-sectional view showing a conventional semiconductor element having a trench structure.

A second semiconductor element is obtained by improving the semiconductor element shown in FIG. 12. This semiconductor element includes a transistor region in which a plurality of MOSFETs are formed. Each of the MOSFETs includes a first conductivity type source region formed in the second conductivity type semiconductor, a recess that penetrates the source region and the second conductivity type semiconductor to reach the first conductivity type drift region and a gate electrode provided on an insulating film formed on the first surface side. In each of the MOSFETs, the second conductivity type semiconductor is provided on the first surface side, and the source electrode is provided so as to be in contact with the second conductivity type semiconductor and the source region.

In this transistor region, the Schottky diode is included in the transistor region and formed by contact between the drift region exposed between the transistors on the first surface side and the metal electrode. The structure of this semiconductor element also is advantageous in that not only the compactness of the element and the reduction of the reverse recovery time can be achieved, but also the breakdown voltage can be ensured.

Furthermore, another embodiment of the second semiconductor element includes a MOSFET that further includes a first conductivity type source region formed in the second conductivity type semiconductor, a recess that penetrates the source region and the second conductivity type semiconductor to reach the first conductivity type drift region and a gate electrode provided on an insulating film formed on the first surface side. In the MOSFETs, the second conductivity type semiconductor is provided on the first surface side, and the source electrode is provided so as to be in contact with the second conductivity type semiconductor and the source region.

This semiconductor element is characterized in that the Schottky diode is formed by contact between the drift region in contact with the recess and the metal electrode. The structure of this semiconductor element also is advantageous in that not only the compactness of the element and the reduction of the reverse recovery time can be achieved, but also the breakdown voltage can be ensured.

The present invention further can be applied to a junction field-effect transistor (junction FET). A third semiconductor element of the present invention including a junction FET includes a first conductivity type source region on the first surface side, and a gate electrode. In the junction FET, the source electrode is provided so as to be in contact with the source region and the gate electrode is provided so as to be in contact with the second conductivity type semiconductor. The Schottky diode is formed by contact between the drift region exposed on the first surface side and the metal electrode. According to this semiconductor element, a normally off type junction FET can be achieved and the breakdown voltage can be improved.

Hereinafter, preferred embodiments of the present invention will be described with reference to the accompanying drawings.

First Embodiment

An embodiment of the first semiconductor element will be described with reference to FIG. 1.

In this semiconductor element 1, a semiconductor in which an n-type epitaxial growth layer 12 is formed on an n$^+$-type silicon carbide (SiC) substrate 11 is used as the substrate. A plurality of island-shaped p-type semiconductor regions 13 are formed in predetermined positions on the surface of the substrate by ion implantation or diffusion. N$^+$-type semiconductor regions 14 serving as source regions are formed in the p-type regions 13 also by ion implantation or the like.

On the surface of the substrate, source electrodes 19 are formed so as to be in contact with the n$^+$-type regions 14, and a drain electrode 17 is formed on the n$^+$-type substrate 11 serving as a drain region on the back surface of the substrate. The junctions between the source electrode 19 and the drain electrode 17 and the semiconductor are ohmic junctions. The gate electrodes 18 are formed on the p-type regions 13 via insulating films 16, for example silicon oxide films, formed by oxidation. When an inversion layer (channel) is formed in the surface layer of the p-type regions 13 immediately below the gate electrode by applying a bias voltage to the gate electrode, the MOSFET is turned on.

In this semiconductor element, metal electrodes (Schottky electrode) 20 that form a Schottky junction with the n-type layer 12 are provided on the n-type layer 12 exposed on the surface between adjacent MOSFETs, that is, between adjacent p-type regions 13 and 13. These Schottky electrodes 20 formed on the drift regions are electrically connected to the source electrodes 19 by wiring.

Also in this semiconductor element, parasitic diodes including the p-type region 13 and the n-type layer 12 exist between the source and the drain. However, a delay due to reverse recovery time from the on-state to the off-state due to the parasitic diodes can be reduced by the Schottky diode constituted by the junction between the Schottky electrode 20 and the n-type layer 12. In other words, in the on-state where an inversion layer (channel) is produced in the surface layer of the p-type region 13, when a bias voltage is changed to be negative so that the channel is made to disappear, a quick response from the on-state to the off-state can be achieved. This is because the voltage between the source and the drain can be increased promptly without reflecting the slow recovery property of the parasitic diode because of the Schottky diode provided parallel to the parasitic diode. On the other hand, when this MOSFET is on, current does not flow through the Schottky diode, so that this diode does not affect the element operation.

In the off-state, a depletion layer 15 is spread to a portion immediately below the Schottky electrode 20, so that the thickness of the depletion layer near the center of the distance d is increased. Therefore, even if the distance d between the adjacent p-type regions 13 and 13 is increased for a large current flow, the breakdown voltage of the element is easy to ensure.

In addition, this semiconductor element does not require an additional opposite conductivity type region (e.g., the guard ring region 121 in FIG. 13) to ensure the breakdown voltage. Thus, the semiconductor element of the present invention may be characterized in that the field effect transistor and the Schottky diode are arranged so that a second conductivity type semiconductor other than the second conductivity type semiconductor constituting the field effect transistor is not interposed between the electric field effect transistor and the Schottky diode.

In this semiconductor element, the p-type region 13 exists near the Schottky diode, and therefore the depletion layer due to the Schottky diode is formed so as to overlap with the depletion layer spreading from the interface between the p-type region 13 and the n-type layer 12 to the inner portion of the n-type layer. Therefore, the breakdown voltage of the diode itself is easy to ensure.

Figure 1:
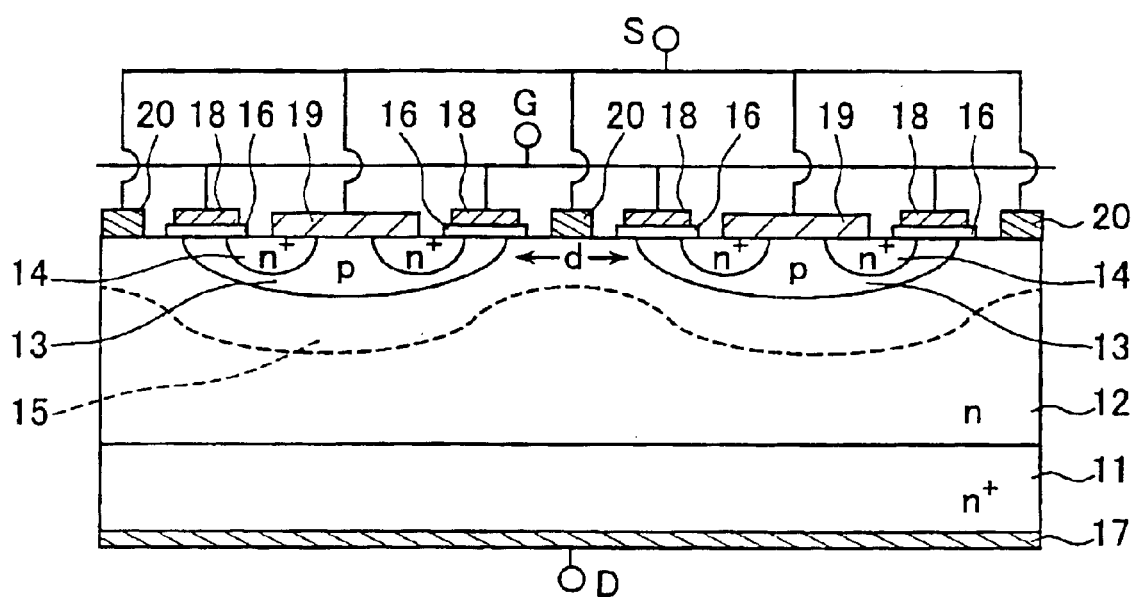
FIG. 1 is a cross-sectional view (taken along line I—I of FIG. 2) showing an example of a semiconductor element of the present invention.
Figure 2:
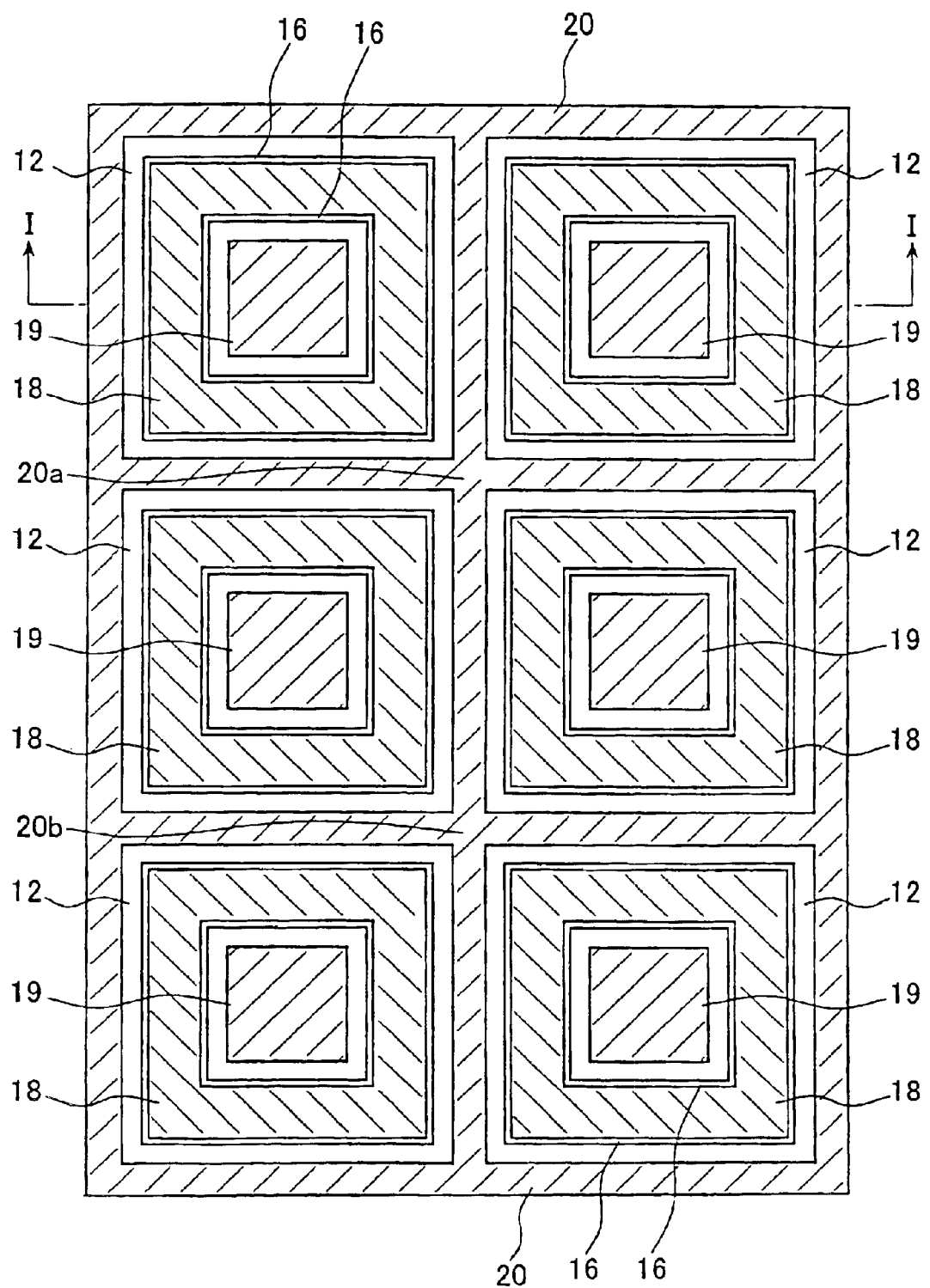
FIG. 2 is a plan view showing an example of a semiconductor element of the present invention.

FIG. 2 is a plan view of the semiconductor element (FIG. 1 is a cross-sectional view taken along line I—I of FIG. 2). In this embodiment, six MOSFETs are arranged, but there is no limitation regarding the number of MOSFETs, and the number of MOSFETs to be integrated can be determined suitably based on the desired current capacity or the like. In this embodiment, MOSFETs having the same shape (a square in a plan view) are arranged regularly in the longitudinal and lateral directions, but there is no particular limitation regarding the shape of the MOSFETs and the arrangement. For example, it may be advantageous if the corners of the gate electrode 18 having a square shape in a plan view are rounded in view of ensuring the breakdown voltage. The entire electrode can be of a polygonal or circular shape (see FIG. 6). Furthermore, a structure that can improve the breakdown voltage, such as a guard ring, can be provided outside the entire MOSFET region.

In the MOSFET region in which a predetermined number of MOSFETs are arranged, the Schottky electrodes 20 extend between the MOSFETs in the longitudinal and lateral directions. When the Schottky elements are arranged between the adjacent MOSFETs in this manner, the Schottky diode can be formed close to the MOSFETs without providing an additional region for forming the Schottky electrode (see the Schottky diode region of FIG. 13), which is required in the conventional element. Since the region between MOSFETs that has not been used previously is utilized, the formation of the Schottky diode causes no detriment to the compactness of the element.

The Schottky electrodes 20 are not necessarily arranged in a lattice shape as shown in FIG. 2, and can be arranged in a stripe shape or discretely in an irregular manner. When the Schottky electrodes 20 are arranged discretely in an irregular manner, it is preferable to form the Schottky electrodes 20 in positions including, for example, at least the intersections 20$a$, 20$b$, . . . of the lattice pattern extending in the longitudinal and lateral directions.

In the above, an example using silicon carbide has been described, but the above-described semiconductor element can be formed of other compound semiconductors such as AlN, GaN or the like (so-called wide band gap compound semiconductors having a wider band gap than that of silicon). When a wide band gap compound semiconductor such as silicon carbide is used, it is easy to ensure the breakdown voltage between the Schottky electrode and the drain electrode. When the silicon carbide is obtained by causing epitaxial growth on the surface of a silicon carbide substrate that is either one of the following planes I and II to form a silicon carbide layer, an epitaxial growth layer having good crystallinity can be obtained.

I. (111) Si plane of β-SiC, (0001) Si plane of 6H or 4H-SiC, or Si plane of 15R-SiC, or offcut planes within 10 degrees of these Si planes; and II. (100) plane of β-SiC, (110) plane of β-SiC, (1–100) plane of 6H or 4H-SiC, (11–20) plane of 6H or 4H-SiC, or offcut planes within 15 degrees of these planes.

The above embodiment has been described with the n-type as the first conductivity type and the p-type as the second conductivity type, but the n-type and the p-type can be switched.

Second Embodiment

An embodiment of the second semiconductor element will be described with reference to FIG. 3.

In this semiconductor element, a semiconductor in which an n-type epitaxial growth layer 22 is formed on an $n^+$-type silicon carbide substrate 21 is used as the substrate. A p-type semiconductor region 23 is formed partially on the surface of the substrate by ion implantation or diffusion. An $n^+$-type semiconductor region 24 serving as a source region is formed in the p-type region 23 also by ion implantation or the like. A recess penetrating the p-type region 23 to reach the n-type layer 22 is formed in the $n^+$-type region 24 by photolithography and etching to form a trench structure.

A gate electrode 28 is provided via an insulating film (e.g. silicon oxide film) 26 formed by oxidation in the recess. A source electrode 29 is provided so as to be in contact with the $n^+$-type region 24 and the p-type region 23. A drain electrode 27 is provided on the back surface of the substrate so as to be in contact with the $n^+$-type silicon carbide substrate 21 serving as a drain region. The junctions between the source electrode 29 and the drain electrode 27 and the semiconductor are ohmic junctions. In the silicon carbide MOSFET having a trench structure, an inversion layer produced by applying a bias voltage to the gate electrode 28 is formed so as to extend along the thickness direction of the semiconductor in the p-type regions 23 in contact with the trench wall surface. This inversion layer serves as a channel so that the MOSFET is turned on.

Also in this semiconductor element, a Schottky electrode 20 is further provided. This is a metal electrode that forms a Schottky junction with the n-type layer 22 exposed on the surface of the semiconductor adjacent to the p-type region 23. The Schottky electrode 20 can be formed as a metal layer that is in contact with the source electrode 29 on the surface of a drift region (of the same conductivity type) that is electrically continuous to the drain region of the semiconductor serving as the substrate. When the Schottky electrode 20 is considered as a part of the source electrode 29, it can be said that a part of the source electrode forms a Schottky junction with the n-type semiconductor region in this semiconductor element.

Also in this semiconductor element, a parasitic diode including the p-type region 23 and the n-type layer 22 exists between the source and the drain. Also in this embodiment, however, the reverse recovery time from the on-state to the off-state due to the parasitic diode can be reduced by the Schottky diode constituted by the junction of the Schottky electrode 20 and the n-type layer 22.

Furthermore, the depletion layer spreading immediately below the Schottky electrode 20 makes it easy to ensure the breakdown voltage of the element. More specifically, in the semiconductor element having a conventional trench structure, breakdown tends to occur at the interface point B at the surface of the semiconductor on which the electric field is concentrated. However, the arrangement of the Schottky electrode 20 makes it possible for the depletion layer to spread near the interface B in the surface of the semiconductor, so that breakdown is less likely to occur, and the breakdown voltage between the source and the drain in the off-state can be improved.

Basically, this semiconductor element does not require an additional opposite conductivity type (p-type in this case) region to ensure the breakdown voltage, such as a guard ring region. The depletion layer due to the Schottky diode is superimposed on the depletion layer spreading from the interface between the p-type region 23 and the n-type layer 22 to the inner portion of the n-type layer. Therefore, the breakdown voltage of the diode itself is easy to ensure. In this semiconductor element, silicon carbide is used, so that a higher breakdown voltage than when silicon is used can be obtained. Since a trench structure is formed, this embodiment is advantageous in that a higher breakdown voltage and a larger current capacity can be obtained.

Figure 3:
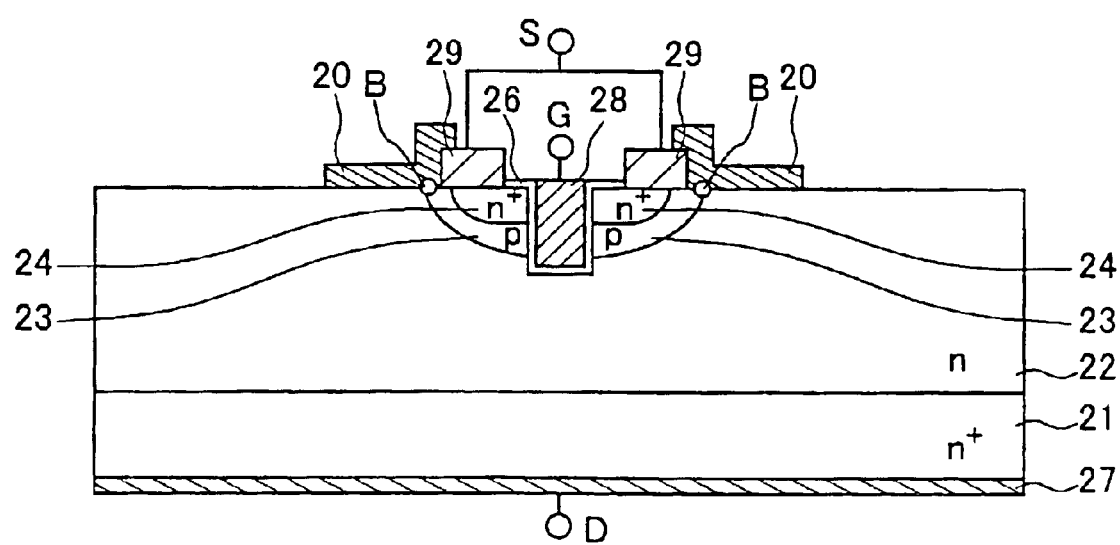
FIG. 3 is a cross-sectional view showing an element having a trench structure as an example of a semiconductor element of the present invention.
Figure 4:
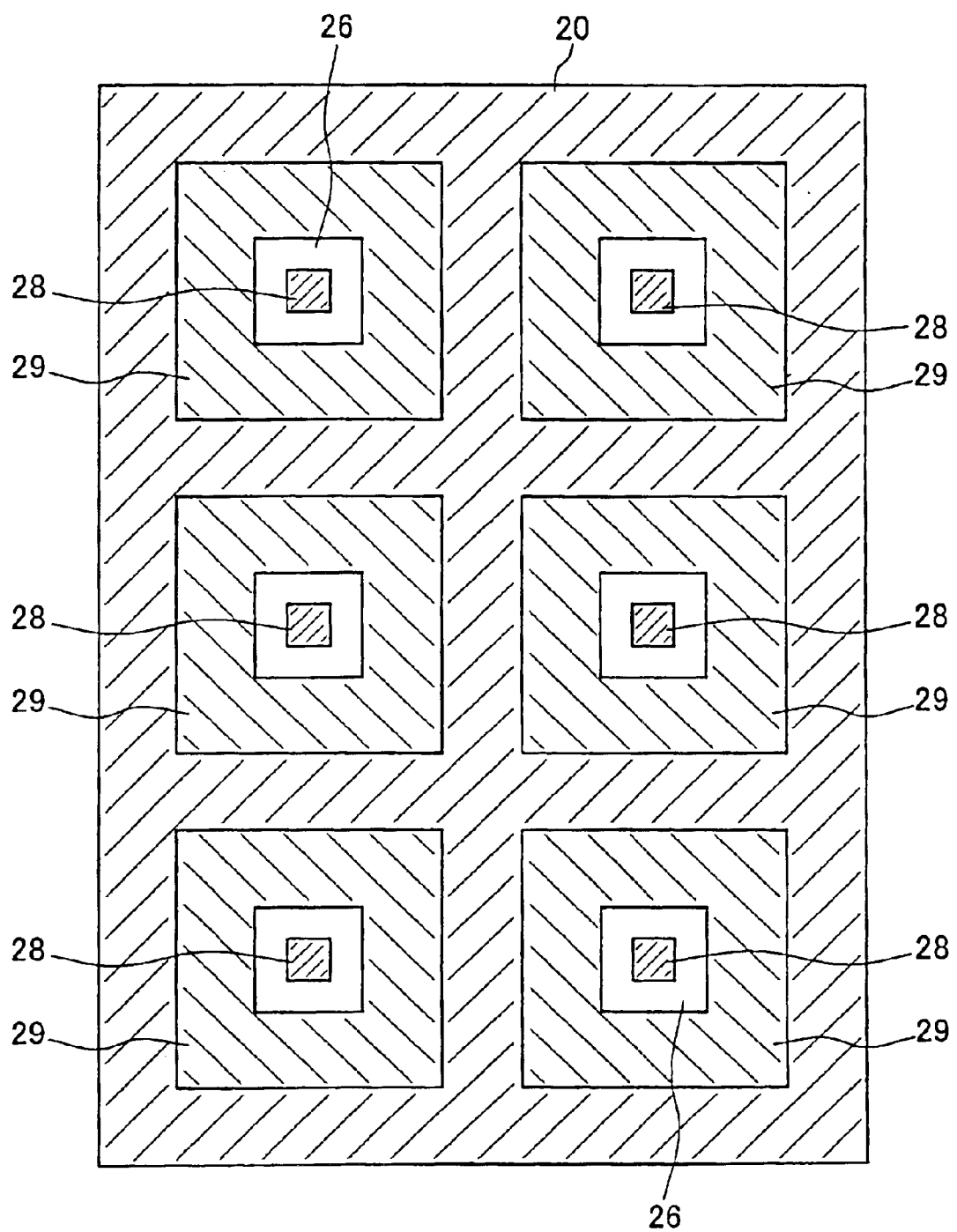
FIG. 4 is a plan view showing an example of an arrangement of the semiconductor element of FIG. 3.

FIG. 4 is a plan view showing an example of the arrangement of the semiconductor element of FIG. 3. In this embodiment as well, as described with reference to FIG. 2, there is no particular limitation regarding the number of MOSFETs, the shape, the arrangement or the like. The arrangement and the shape of the Schottky electrode 20 are not limited to a lattice shape.

Figure 5:
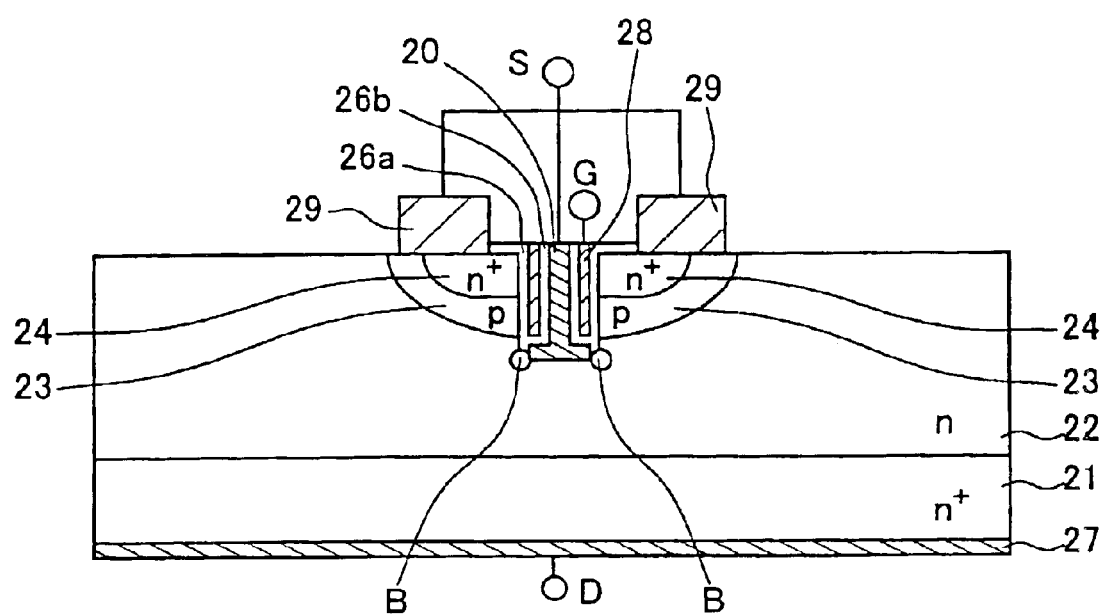
FIG. 5 is a cross-sectional view showing another example of a semiconductor element having a trench structure of the present invention.
Figure 6:
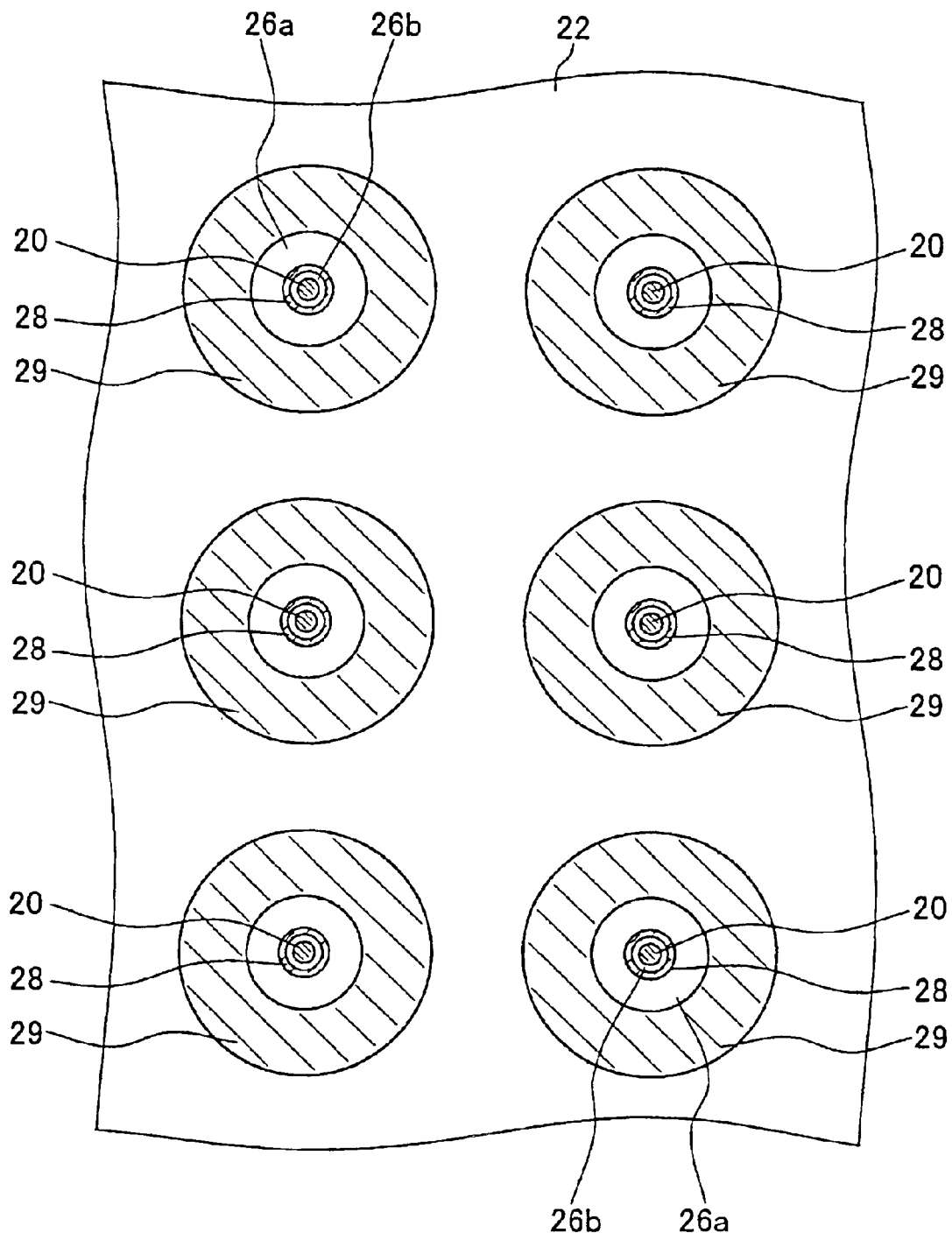
FIG. 6 is a plan view showing an example of an arrangement of the semiconductor element of FIG. 5.
Figure 7:
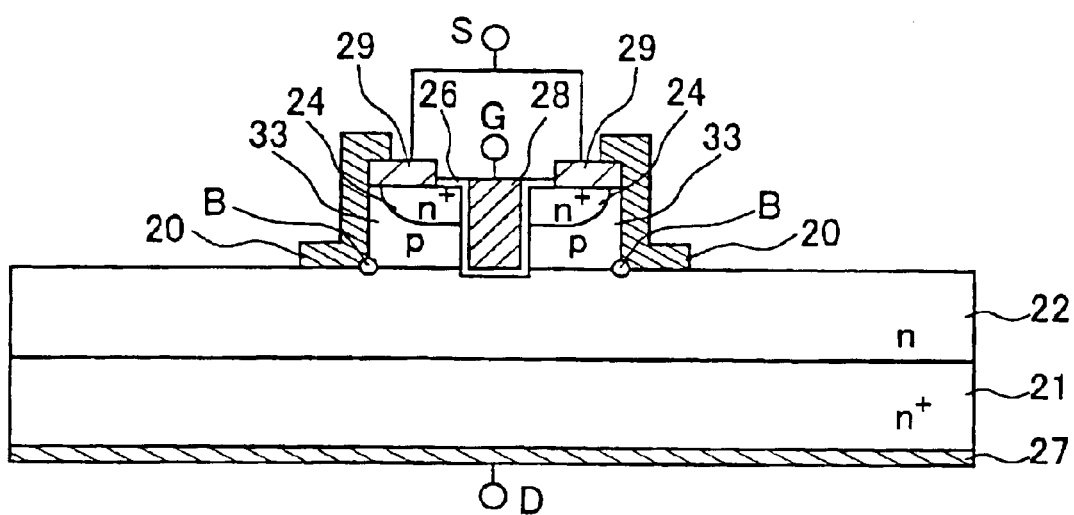
FIG. 7 is a cross-sectional view showing still another example of a semiconductor element having a trench structure of the present invention.

FIGS. 5 to 7 show other embodiments of the second semiconductor element.

The Schottky electrode 20 in the semiconductor element shown in FIGS. 5 and 6 is in contact with the n-type layer 22, not on the surface of the semiconductor, but on the bottom surface of the trench structure. A gate electrode 28 in contact with the wall surface of the trench structure via a first insulating film (silicon oxide film) 26a is provided in the recess forming the trench structure. The gate electrode 28 and the Schottky electrode 20 are insulated from each other by a second insulating film (silicon oxide film) 26b. Thus, also when a metal electrode is formed in the drift region in contact with the bottom surface of the trench structure to form the Schottky diode, the reverse recovery time from the on-state to the off-state can be reduced, as in the above embodiments. Also in this embodiment, the shape of the electrode shown in FIG. 6 and the like are only an example.

When using the embodiment shown in FIGS. 5 and 6, the depletion layer can be spread from the bottom of the trench structure to a lower portion. Therefore, the breakdown voltage between the gate and the drain in the off-state can be increased, which makes it easy to suppress breakdown at the electric field concentration point B.

In the semiconductor element shown in FIG. 7, a p-type semiconductor layer 33 that has been grown epitaxially on the n-type layer 22 is used as the p-type semiconductor region, instead of the region formed in the semiconductor. In this embodiment, the recess for forming a trench structure is formed so as to penetrate the p-type layer from the $n^+$-type region 24 formed on the surface of the p-type layer 33 to reach the n-type layer 22. The source electrode 29 is in contact with the $n^+$-type region 24 and the p-type layer 33, the Schottky electrode 20 is in contact with the n-type layer 22, and these two electrodes are in contact with each other. In this embodiment as well, the reverse recovery time from the on-state to the off-state can be reduced.

Also in the embodiment shown in FIG. 7, the arrangement of the Schottky electrode 20 makes it possible for the depletion layer to spread near the electric field concentration point B where breakdown tends to occur, so that the breakdown voltage between the source and the drain in the off-state can be improved.

In the semiconductor elements in the first and the second embodiments, FETs are formed, and no extra p-type regions other than the p-type regions participating in the operation of the FETs are included between the FETs and the Schottky diodes. The semiconductor elements in the first and the second embodiments have a structure that can reduce the reverse recovery time due to the parasitic diode in a very rational manner with a small element area without forming a separate region while ensuring the breakdown voltage of the Schottky diode by utilizing the p-type regions constituting the FETs. Also in this embodiment, when the silicon carbide is obtained by causing epitaxial growth in a silicon carbide layer on the surface of a silicon carbide substrate that is either one of the above planes I and II, an epitaxial growth layer having good crystallinity can be obtained. The above embodiment has been described with the n-type as the first conductivity type and the p-type as the second conductivity type, but the n-type and the p-type can be switched.

Third Embodiment

An embodiment of the third semiconductor element will be described with reference to FIGS. 8 and 9.

In this semiconductor element, a junction FET is formed. In this semiconductor, a semiconductor in which a first n-type epitaxial growth layer 12a and a second n-type epitaxial growth layer 12b are formed in this order on an n$^+$-type silicon carbide substrate 11 serving as a drain region is used as the substrate. A first p-type semiconductor region 43a and a second p-type semiconductor region 43b are formed in the substrate. The first p-type semiconductor region 43a and the second p-type semiconductor region 43b are formed by ion implantation from the surfaces of the first n-type epitaxial growth layer 12a and the second n-type epitaxial growth layer 12b, respectively, after the two growth layers are formed. The first p-type region 43a functions as a separating layer of the n-type layer constituting the drift region.

An n$^+$-type semiconductor region 14 serving as a source region is formed on the surface of the second n-type region 12b. Furthermore, a source electrode 19 is formed on the surface of the substrate so as to be in contact with the n$^+$-type region 14, and a drain electrode 17 is formed on the back surface of the substrate so as to be in contact with the n$^+$-type silicon substrate 11. The source electrode 19 and the drain electrode 17 form ohmic junctions with the semiconductor. A gate electrode 18 is provided so as to be in contact with the second p-type region 43b.

In this semiconductor, a metal electrode (Schottky electrode) 20 is provided on the second n-type layer 12b that becomes a part of a drift region through which electrons flow in the on-state. The Schottky electrode 20 is in contact with the source electrode 19. When the Schottky electrode 20 is considered as a part of the source electrode 19, a part of the source electrode forms a Schottky junction with the n-type region in this semiconductor element.

Figure 8:
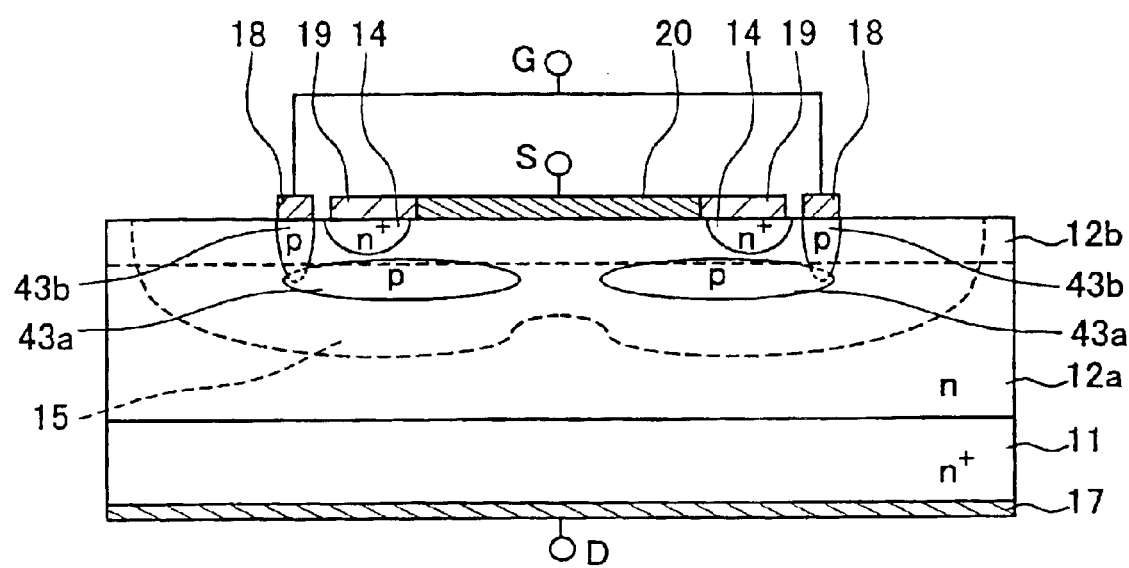
FIG. 8 is a cross-sectional view showing an example (off-state) of a semiconductor element including a junction FET of the present invention.

This semiconductor element is designed such that when a bias voltage is not applied to the gate electrode 18, the depletion layer 15 spreads to the periphery of the first p-type region 43a serving as the separate layer as shown in FIG. 8. Also in the second n-type layer 12b near the Schottky electrode 20, the depletion layer stemming from the Schottky electrode spreads to overlap with the depletion spreading to the periphery of the p-type region. This spread and superimposition of the depletion layer can achieve a normally off type junction FET (not a regular junction FET). Furthermore, since the Schottky electrode 20 is provided in the region surrounded by the second p-type layer 43b, the breakdown voltage can be improved without increasing the element area.

Figure 9:
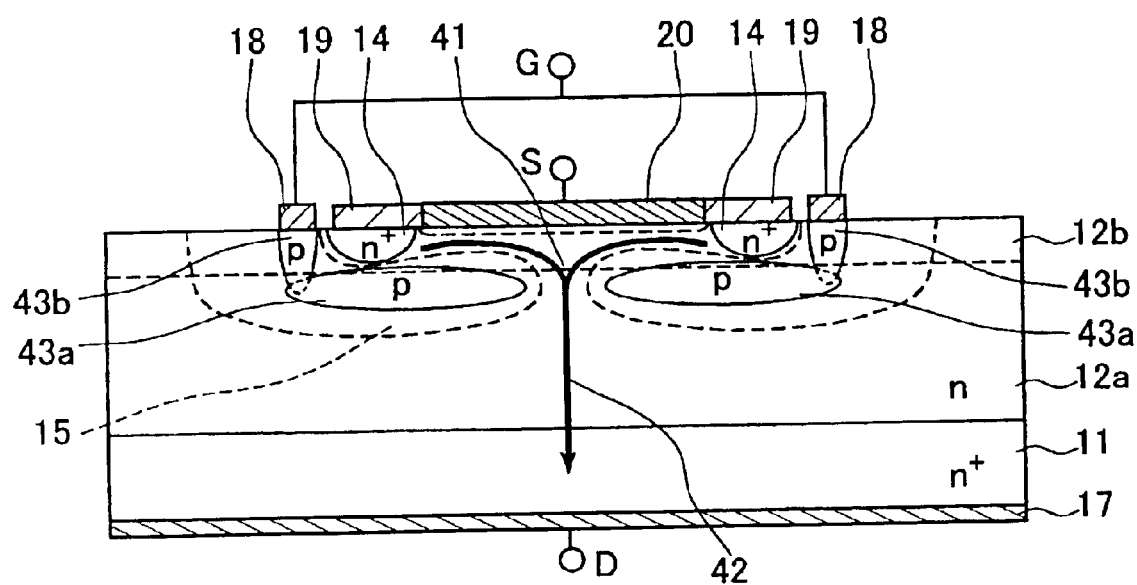
FIG. 9 is a cross-sectional view showing the on-state of the semiconductor element of FIG. 8.

In this semiconductor element, when the depletion layer is allowed to recede by applying a positive bias voltage to the gate electrode, a channel 41 that allows conduction between the upper and the lower portions of the separating layer is generated between the p-type regions 43a and 43a, as shown in FIG. 9. In the second n-type layer 12b as well, a channel is generated between the first p-type region 43a and the Schottky electrode 20. Thus, an electron flow 42 from the source electrode 19 to the drain electrode occurs so that the element is turned on.

Figure 10:
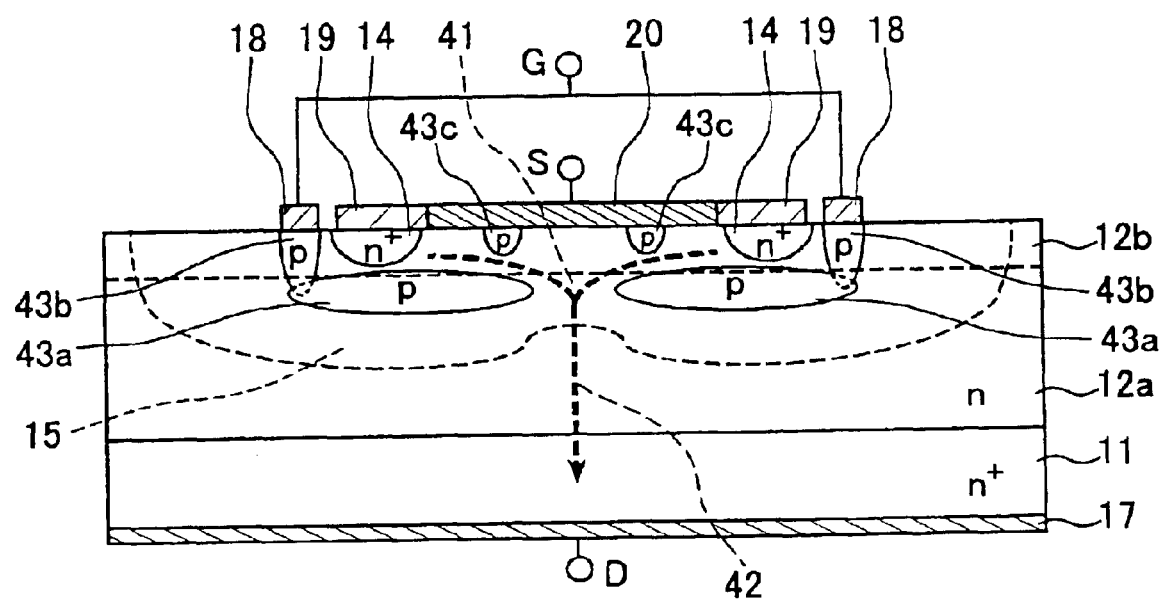
FIG. 10 is a cross-sectional view showing another example of a semiconductor element including a junction FET of the present invention.

In this junction FET, as shown in FIG. 10, a p-type region 43c further can be formed immediately below the metal layer 20, as shown in FIG. 10. This region 43c ensures the spread of the depletion layer to a higher extent. Therefore, the off-state under no application of a bias voltage can be attained more reliably.

In this embodiment, other compound semiconductors such as AlN, GaN or the like can be used in place of the silicon carbide to improve the breakdown voltage further. In the case of the silicon carbide, when the silicon carbide is obtained by causing epitaxial growth in a silicon carbide layer on the surface of a silicon carbide substrate that is either one of the above planes I and II, an epitaxial growth layer having good crystallinity can be obtained. The above embodiment has been described with the n-type as the first conductivity type and the p-type as the second conductivity type, but the n-type and the p-type can be switched.

In this embodiment as well as in the first and the second embodiments, a FET region in which a predetermined number of FETs are arranged can be prepared to increase the current capacity. Also in this embodiment, the FETs can be arranged in such a manner as described with reference to FIGS. 2 and 4. In the semiconductor element of this embodiment as well as the semiconductor elements of the first and the second embodiments, FETs are formed, and no excessive p-type regions other than the p-type regions participating in the operation of the FETs are included between the FETs and the Schottky diodes. In this semiconductor element, the breakdown voltage is improved by arranging the FET and the Schottky diode closely.

EXAMPLES

Hereinafter, the present invention will be described more specifically by way of example. However, the present invention is not limited to the following examples.

Example 1

In this example, a semiconductor element having the same structure as shown in FIG. 1 was produced.

First, a substrate was prepared, having a surface off-cut to an orientation 4 degrees offset from the [11–20] direction of an n-type 6H-SiC (0001) Si plane that was doped with nitrogen so that the concentration was $3\times10^{18}$ cm$^{-3}$. After cleaning this substrate, an n-type epitaxial growth layer doped with $1.3\times10^{16}$ cm$^{-3}$ of nitrogen was formed on the off-cut surface. This n-type layer was formed by CVD such that the thickness was 10 µm. A metal mask was formed on the surface of this n-type layer, and ion energy was selected selectively from five levels in the range from 0.9 to 4.0 MeV for boron ion implantation in a dose amount of $3\times10^{14}$ cm$^{-2}$ for each. This ion implantation formed an island shaped p-type region with a depth of about 2 µm in the surface layer of the n-type layer. Furthermore, using another metal mask, nitrogen ion implantation was performed at an energy of 20 keV and in a dose amount of $5\times10^{15}$ cm$^{-2}$ partially in the p-type region to form an n$^+$-type semiconductor region serving as a source region. The substrate temperature for the ion implantation of boron and nitrogen was 500° C. In this substrate, the region formed by ion implantation was activated by a one hour heat treatment at 1700° C. in an Ar atmosphere. The length of the channel region of the thus formed MOSFET was about 2 μm.

Subsequently, the silicon carbide substrate was subjected to wet oxidation for 3 hours at 1100° C. in a chamber for an oxidation treatment. This oxidation treatment formed a silicon oxide film having a thickness of 40 nm on the surface of the semiconductor substrate. Contact holes or the like were formed on the silicon oxide film by photolithography and etching. Furthermore, Ni was deposited for each of the source electrode and the drain electrode and a heat treatment was performed to form ohmic electrodes. Then, a gate electrode was formed on the silicon oxide film. Furthermore, a Ni Schottky electrode was formed so as to be joined with the n-type layer exposed between the adjacent p-type regions. The arrangement of the electrodes was as shown in FIG. 1.

The breakdown voltage of the thus obtained silicon carbide MOSFET was 600 V or more, whereas it was about 500 V when the Schottky electrode was not formed. Moreover, the reverse recovery time from the on-state to the off-state of the semiconductor element was 100 ns or less, whereas it was 300 ns or more when the Schottky electrode was not formed. Thus, providing the Schottky electrode between the adjacent MOSFETs can result in MOSFETs with a low loss and a high breakdown voltage.

Example 2

In this example, a semiconductor element having the same structure as shown in FIG. 3 was produced.

First, a substrate was prepared, having a surface off-cut to an orientation 4 degrees offset from the [11–20] direction of an n-type 6H-SiC (0001) Si plane that is doped with nitrogen so that the concentration was $3\times10^{18}$ cm$^{-3}$. After cleaning this substrate, an n-type epitaxial growth layer doped with $1.3\times10^{16}$ cm$^{-3}$ of nitrogen was formed on the off-cut surface. This n-type layer was formed by CVD such that the thickness was 10 μm. A metal mask was formed on the surface of this n-type layer, and ion energy was selected selectively from five levels in the range from 0.9 to 4.0 MeV for boron ion implantation in a dose amount of $3\times10^{14}$ cm$^{-2}$ for each. This ion implantation formed a p-type region with a depth of about 2 μm in the surface layer of the n-type layer. Furthermore, using another metal mask, nitrogen ion implantation was performed at an energy of 20 keV and in a dose amount of $5\times10^{15}$ cm$^{-2}$ partially in the p-type region to form an n$^+$-type region serving as a source region. The substrate temperature for the ion implantation of boron and nitrogen was 500° C. In this substrate, the region formed by ion implantation was activated by a one hour heat treatment at 1700° C. in an Ar atmosphere.

Furthermore, a recess for forming a trench structure was formed on the silicon carbide substrate. The recess was formed with an ICP (inductive coupled plasma) etching apparatus after a mask was formed. A mixed gas of CF$_4$ and O$_2$ was used for etching. The length of the formed recess was 2.5 μm, penetrating both the n$^+$-type and the p-type semiconductor regions to reach the n-type layer.

Subsequently, the semiconductor substrate was subjected to wet oxidation for one hour at 1100° C. in a chamber for an oxidation treatment. This oxidation treatment formed a silicon oxide film having a thickness of 40 nm on the surface of the semiconductor substrate. Contact holes or the like were formed on the silicon oxide film by photolithography and etching. Furthermore, Ni was deposited for each of the source electrode and the drain electrode and a heat treatment was performed to form ohmic electrodes. Then, a gate electrode made of Al was formed in the recess. Furthermore, a Ni Schottky electrode was formed in contact with the n-type layer and adjacent to the source electrode layer. The arrangement of the electrodes was as shown in FIG. 3.

The breakdown voltage of the thus obtained silicon carbide MOSFET was 600 V or more, whereas it was about 500 V when the Schottky electrode was not formed. Moreover, the reverse recovery time from the on-state to the off-state of the semiconductor element was 100 ns or less, whereas it was 300 ns or more when the Schottky electrode was not formed. Thus, providing the Schottky electrode between the adjacent MOSFETs can result in MOSFETs with a low loss and a high breakdown voltage.

Example 3

In this example, a semiconductor element having the same structure as shown in FIG. 7 was produced.

First, a substrate was prepared, having a surface off-cut to an orientation 4 degrees offset from the [11–20] direction of an n-type 6H-SiC (0001) Si plane that is doped with nitrogen so that the concentration was $3\times10^{18}$ cm$^{-3}$. After cleaning this substrate, an n-type epitaxial growth layer doped with $1.3\times10^{16}$ cm$^{-3}$ of nitrogen was formed on the off-cut surface. This n-type layer was formed by CVD such that the thickness was 10 μm. A p-type epitaxial growth layer doped with $2\times10^{17}$ cm$^{-3}$ of Al was formed partially on the surface of the n-type layer while TMA was added during the film-formation by CVD. The thickness of the p-type layer was 2 μm. Furthermore, using a metal mask, nitrogen ion implantation was performed at an energy of 20 keV and in a dose amount of $5\times10^{15}$ cm$^{-2}$ partially in the p-type region to form an n$^+$-type semiconductor region serving as a source region. The substrate temperature for the ion implantation was 500° C. In this substrate, the region formed by ion implantation was activated by a one hour heat treatment at 1700° C. in an Ar atmosphere.

Furthermore, a recess for forming a trench structure was formed on this semiconductor substrate. The recess was formed with an ICP etching apparatus after a mask was formed. A mixed gas of CF$_4$ and O$_2$ was used for etching. The length of the formed recess was 2.5 μm, penetrating the n$^+$-type semiconductor region and the p-type layer to reach the n-type layer.

Subsequently, the semiconductor substrate was subjected to wet oxidation for one hour at 1100° C. in a chamber for an oxidation treatment. This oxidation treatment formed a silicon oxide film having a thickness of 40 nm on the surface of the semiconductor substrate. Contact holes or the like were formed on the silicon oxide film by photolithography and etching. Furthermore, Ni was deposited for each of the source electrode and the drain electrode and a heat treatment was performed to form ohmic electrodes. Then, a gate electrode made of Al was formed in the recess. Furthermore, a Ni Schottky electrode was formed in contact with the n-type layer and adjacent to the source electrode. The arrangement of the electrodes was as shown in FIG. 7.

The breakdown voltage of the thus obtained silicon carbide MOSFET was 600 V or more, whereas it was about 500 V when the Schottky electrode was not formed. Moreover, the reverse recovery time from the on-state to the off-state of the semiconductor element was 100 ns or less, whereas it was 300 ns or more when the Schottky electrode was not formed. Thus, providing the Schottky electrode between the adjacent MOSFETs can result in MOSFETs with a low loss and a high breakdown voltage.

Example 4

In this example, a semiconductor element having the same structure as shown in FIGS. 8 and 9 was produced.

First, a substrate was prepared, having a surface off-cut to an orientation 4 degrees offset from the [11–20] direction of an n-type 6H-SiC (0001) Si plane that is doped with nitrogen so that the concentration was $3\times10^{18}$ cm$^{-3}$. After cleaning this substrate, a first n-type epitaxial growth layer doped with $1.3\times10^{16}$ cm$^{-3}$ of nitrogen was formed on the off-cut surface. This first n-type layer was grown by CVD such that the thickness was 10 μm. A metal mask was formed on the surface of the first n-type layer, and aluminum ions were implanted selectively at 200 keV and in a dose amount of $3\times10^{14}$ cm$^{-2}$. This ion implantation formed a first p-type semiconductor region with a depth of about 0.3 μm in the surface layer of the first n-type layer. Furthermore, a second n-type epitaxial growth layer doped with $1.3\times10^{16}$ cm$^{-3}$ of nitrogen was formed on the first n-type layer. This second n-type layer was grown by CVD such that the thickness was 0.5 μm. A metal mask was formed on the surface of the second n-type layer, and aluminum ions were implanted selectively at 50 keV to 1.0 MeV and in a dose amount of $3\times10^{14}$ cm$^{-2}$. This implantation formed a second p-type semiconductor region that penetrated the second n-type layer and was connected to the first p-type semiconductor region. Furthermore, using another metal mask, nitrogen ion implantation was performed at an energy of 20 keV and in a dose amount of $5\times10^{15}$ cm$^{-2}$ to partially form an n$^+$-type semiconductor region serving as a source region. The substrate temperature for the ion implantation was 500° C. In this substrate, the region formed by ion implantation was activated by a one hour heat treatment at 1700° C. in an Ar atmosphere.

Subsequently, the Ni was deposited for each of the source electrode and the drain electrode and a heat treatment was performed to form ohmic electrodes. Then, a gate electrode made of Al was formed. Furthermore, a Ni Schottky electrode was formed. The arrangement of the electrodes was as shown in FIGS. 8 and 9.

The breakdown voltage of the thus obtained silicon carbide MOSFET was 600 V or more, whereas it was about 500 V when the Schottky electrode was not formed. Thus, a normally off type junction FET with a high breakdown voltage was obtained by providing the Schottky element between adjacent junction FETs.

In the above, the embodiments using silicon carbide have been described. However, it is possible to form the semiconductor element of the present invention with other semiconductors such as silicon. In a semiconductor element using silicon, even if the Schottky diode is formed as disclosed in the above publication, the breakdown voltage is from several tens volts to 100 V at most. However, according to the present invention, a silicon semiconductor element having a breakdown voltage of about 150 V can be obtained. It is believed that superimposition of the depletion layers contributes to the increase of the breakdown voltage.

According to the present invention, in semiconductor elements, a delay due to reverse recovery time caused by a parasitic diode can be reduced while suppressing an increase of the element area. Moreover, the breakdown voltage in the semiconductor elements can be increased. According to the present invention, the breakdown voltage can be increased to about 150 V in silicon semiconductors, and to several hundreds volts or up to 1 kV in silicon carbide semiconductors.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor element comprising:
   a semiconductor body made of silicon carbide and including a first conductivity type semiconductor substrate and a first conductivity type epitaxial growth layer formed on the first conductivity type semiconductor substrate;
   an insulated gate field-effect transistor including a second conductivity type semiconductor formed in the first conductivity type epitaxial growth layer on a first surface side of the semiconductor body, a first conductivity type source region formed in the second conductivity type semiconductor, a source electrode provided on the first surface side of the semiconductor body so as to be in contact with the second conductivity type semiconductor and the source region, a drain electrode provided on a second surface side opposite to the first surface side, a first conductivity type drift region included in the first conductivity type epitaxial growth layer, and a gate electrode provided on an insulating film formed on the first surface side; and
   a Schottky diode formed by contact between the first conductivity type drift region and a plurality of metal electrodes,
   wherein a plurality of the field-effect transistors are arranged, and the metal electrodes of the Schottky diode are provided so as to extend between the transistors, the metal electrodes being disposed on a flat surface, and
   wherein the field-effect transistor and the Schottky diode are arranged such that a first depletion layer stemming from the Schottky diode is superimposed on a second depletion layer spreading around the second conductivity type semiconductor in an off-state of the field-effect transistor.

2. The semiconductor element according to claim 1, wherein the silicon carbide is obtained by causing epitaxial growth on a surface of a silicon carbide substrate that is either one of the following I and II to form a silicon carbide layer:
   I. (111) Si plane of β-SiC, (0001) Si plane of 6H or 4H-SiC, or Si plane of 15R-SiC, or offcut planes within 10 degrees of these Si planes; and
   II. (100) plane of β-SiC, (110) plane of β-SiC, (1-100) plane of 6H or 4H-SiC, (11-20) plane of 6H or 4H-SiC, or offcut planes within 15 degrees of these planes.

3. A semiconductor element comprising:
   a semiconductor body made of silicon carbide and including a first conductivity type semiconductor substrate and a first conductivity type epitaxial growth layer formed on the first conductivity type semiconductor substrate;
   an insulated gate field-effect transistor including a second conductivity type semiconductor formed in the first conductivity type epitaxial growth layer on a first surface side of the semiconductor body, a first conductivity type source region formed in the second conductivity type semiconductor, a source electrode provided on the first surface side of the semiconductor body so as to be in contact with the second conductivity type semiconductor and the source region, a drain electrode provided on a second surface side opposite to the first surface side, a first conductivity type drift region included in the first conductivity type epitaxial growth layer, a recess that penetrates the source region and the second conductivity type semiconductor to reach the first conductivity type drift region, and a gate electrode on an insulating film formed in the recess; and a Schottky diode formed by contact between the first conductivity type drift region and a plurality of metal electrodes, wherein a plurality of the field-effect transistors are arranged, and the metal electrodes of the Schottky diode are provided so as to extend between the transistors, the metal electrodes being disposed on a flat surface, and wherein the field-effect transistor and the Schottky diode are arranged such that a first depletion layer stemming from the Schottky diode is superimposed on a second depletion layer spreading around the second conductivity type semiconductor in an off-state of the field-effect transistor.

4. The semiconductor element according to claim 3, wherein, in an on-state of each of the insulated field-effect transistors, a channel extends along the thickness direction of the semiconductor body in the second conductivity type semiconductor, wherein the surface of the recess is covered with an insulating film.

5. The semiconductor element according to claim 3, wherein the silicon carbide is obtained by causing epitaxial growth on a surface of a silicon carbide substrate that is either one of the following I and II to form a silicon carbide layer:
   I. (111) Si plane of β-SiC, (0001) Si plane of 6H or 4H-SiC, or Si plane of 15R-SIC, or offcut planes within 10 degrees of these Si planes; and
   II. (100) plane of β-SiC, (110) plane of β-SiC, (1-100) plane of 6H or 4H-SiC, (11-20) plane of 6H or 4H-SiC, or offcut planes within 15 degrees of these planes.

6. A semiconductor element comprising:
a semiconductor body made of silicon carbide and including a first conductivity type semiconductor substrate and a first conductivity type epitaxial growth layer formed on the first conductivity type semiconductor substrate;

an insulated gate field-effect transistor including a second conductivity type semiconductor formed in the first conductivity type epitaxial growth layer on a first surface side of the semiconductor body, a first conductivity type source region formed in the second conductivity type semiconductor, a source electrode provided on the first surface side of the semiconductor body so as to be in contact with the second conductivity type semiconductor and the source region, a drain electrode provided on a second surface side opposite to the first surface side, a first conductivity type drift region included in the first conductivity type epitaxial growth layer, and a gate electrode provided on an insulating film formed on the first surface side; and a Schottky diode formed by contact between the first conductivity type drift region and a plurality of metal electrodes, wherein a plurality of the field-effect transistors are arranged, and the metal electrodes of the Schottky diode are provided so as to extend between the transistors, the metal electrodes being disposed on a flat surface, and wherein the field-effect transistor and the Schottky diode are arranged closely so that a second conductivity type semiconductor other than said second conductivity type semiconductor is not interposed between the field effect transistor and the Schottky diode.

7. The semiconductor element according to claim 6, wherein the silicon carbide is obtained by causing epitaxial growth on a surface of a silicon carbide substrate that is either one of the following I and II to form a silicon carbide layer:
   I. (111) Si plane of β-SiC, (0001) Si plane of 6H or 4H-SiC, or Si plane of 15R-SiC, or offcut planes within 10 degrees of these Si planes; and
   II. (100) plane of β-SiC, (110) plane of β-SiC, (1-100) plane of 6H or 4H-SiC, (11-20) plane of 6H or 4H-SiC, or offcut planes within 15 degrees of these planes.

8. A semiconductor element comprising:
a semiconductor body made of silicon carbide and including a first conductivity type semiconductor substrate and a first conductivity type epitaxial growth layer formed on the first conductivity type semiconductor substrate;

an insulated gate field-effect transistor including a second conductivity type semiconductor formed in the first conductivity type epitaxial growth layer on a first surface side of the semiconductor body, a first conductivity type source region formed in the second conductivity type semiconductor, a source electrode provided on the first surface side of the semiconductor body so as to be in contact with the second conductivity type semiconductor and the source region, a drain electrode provided on a second surface side opposite to the first surface side, a first conductivity type drift region included in the first conductivity type epitaxial growth layer, a recess that penetrates the source region and the second conductivity type semiconductor to reach the first conductivity type drift region, and a gate electrode on an insulating film formed in the recess; and a Schottky diode formed by contact between the first conductivity type drift region and a plurality of metal electrodes, wherein a plurality of the field-effect transistors are arranged, and the metal electrodes of the Schottky diode are provided so as to extend between the transistors, the metal electrodes being disposed on a flat surface, and wherein the field-effect transistor and the Schottky diode are arranged closely so that a second conductivity type semiconductor other than said second conductivity type semiconductor is not interposed between the field effect transistor and the Schottky diode.

9. The semiconductor element according to claim 8, wherein, in an on-state of each of the insulated field-effect transistors, a channel extends along the thickness direction of the semiconductor body in the second conductivity type semiconductor, wherein the surface of the recess is covered with an insulating film.

10. The semiconductor element according to claim 8, wherein the silicon carbide is obtained by causing epitaxial growth on a surface of a silicon carbide substrate that is either one of the following I and II to form a silicon carbide layer:
   I. (111) Si plane of β-SiC, (0001) Si plane of 6H or4H-SiC, or Si plane of 15R-SiC, or offcut planes within 10 degrees of these Si planes; and
   II. (100) plane of β-SiC, (110) plane of β-SiC, (1-100) plane of 6H or 4H-SiC, (11-20) plane of 6H or 4H-SiC, or offcut planes within 15 degrees of these planes.

* * * * *